United States Patent [19]

Batzer et al.

[11] 4,357,453

[45] Nov. 2, 1982

[54] PHOTOCURABLE POLYMERS OBTAINED FROM SUCCINYLOSUCCINIC ACID AND MALEIC ACID DERIVATIVES, PROCESSES FOR THE PREPARATION OF THE POLYMERS, AND USE OF THE POLYMERS

[75] Inventors: Hans Batzer, Arlesheim, Switzerland; Joel Sinnreich, Bensheim, Fed. Rep. of Germany

[73] Assignee: Ciba-Geigy Corporation, Ardsley, N.Y.

[21] Appl. No.: 259,324

[22] Filed: Apr. 30, 1981

[30] Foreign Application Priority Data

May 7, 1980 [CH] Switzerland .......................... 3553/80

[51] Int. Cl.³ ...................... C08G 63/02; C08G 63/12
[52] U.S. Cl. .................................... 526/271; 526/262; 430/285; 528/309
[58] Field of Search ................ 526/271, 262; 528/309; 430/285

[56] References Cited

U.S. PATENT DOCUMENTS 3,030,208 4/1962 Schellenberg et al. ............. 528/309
3,542,737 11/1970 Keck et al. ........................... 528/309
3,994,952 11/1976 Sinnreich et al. .................... 260/468

OTHER PUBLICATIONS

Helvetica Chimica Acta, vol. 56, Fasc. S (1973)—Nr. 284.
Helvetica Chimica Acta, vol. 62, Fasc. 5, pp. 1682–1687 (1979).

Primary Examiner—Joseph L. Schofer
Assistant Examiner—Peter F. Kulkosky
Attorney, Agent, or Firm—Harry Falber

[57] ABSTRACT

Novel photo-crosslinkable polymers are obtained by reacting, and polycondensing, bis-(hydroxyalkyl) succinylosuccinates or bis-(hydroxycycloalkyl) succinylosuccinates with maleic anhydride, maleinimid or N-methylmaleinimid in a molar ratio of 1:1 to 1:2. The novel polymers are useful as photoresists, and the films consisting of the crosslinked polymers are useful as solvent-resistant membranes for reverse osmosis.

9 Claims, No Drawings

PHOTOCURABLE POLYMERS OBTAINED FROM SUCCINYLOSUCCINIC ACID AND MALEIC ACID DERIVATIVES, PROCESSES FOR THE PREPARATION OF THE POLYMERS, AND USE OF THE POLYMERS

The present invention relates to novel, photocurable polymers obtained from bis-(hydroxyalkyl) succinylosuccinates or bis-(hydroxycycloalkyl)succinylosuccinates and maleic acid derivatives, to processes for their preparation and to the use of the photocrosslinkable polymers, especially as a photoresist, or for producing solvent-resistant semipermeable membranes.

Photo-crosslinkable polymers based on succinylosuccinic acid esters have not previously been described. Helvetica Chimica Acta, volume 56, 1973, pages 2760–2765, and German Offenlegungsschrift No. 2,437,875 have merely disclosed that on irradiation of succinylosuccinic acid or of a dialkyl succinylosuccinate, in the crystalline state, by means of ultraviolet light or γ-radiation, the dimers of these monomers are obtained. The latter are used for the preparation of linear polyesters which possess chelating and thread-forming properties.

It has now been found that the reaction of bis-(hydroxyalkyl) succinylosuccinates or bis-(hydroxycycloalkyl) succinylosuccinates with maleic acid derivatives gives linear polymers which can be crosslinked by photocuring.

Accordingly, the present invention relates to unsaturated, photo-crosslinkable polymers which have a relative viscosity of 1.05 to 2.5, measured on solutions of 1 g of polymer in 100 ml of a solvent consisting of equal parts of phenol and o-dichlorobenzene, at 30° C., and which essentially consist of the recurring structural unit of the formula I

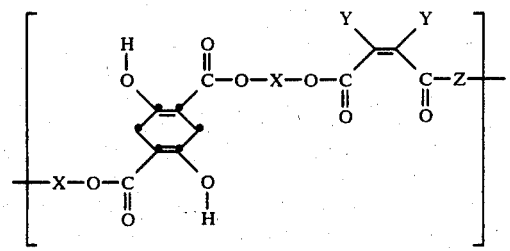

in which X is linear or branched alkylene having 2 to 10 C atoms or a cycloaliphatic or cycloaliphatic-aliphatic radical having up to 15 C atoms, the two Y, independently of one another, are each a hydrogen atom or methyl, and Z is —O—, —NH— or >N—CH$_3$.

Preferably, in the formula I, X is alkylene having 2 to 10 C atoms. Further, both Y are preferably a hydrogen atom, and Z is preferably an oxygen atom.

In particular, the present invention relates to polyesters having the recurring structural unit of the formula I, in which X is alkylene having 2 to 10 C atoms, both Y are a hydrogen atom and Z is an oxygen atom.

The polymers having the recurring structural unit of the formula I can be prepared by polycondensing a succinylosuccinic acid derivative, containing hydroxyl groups, of the formula II

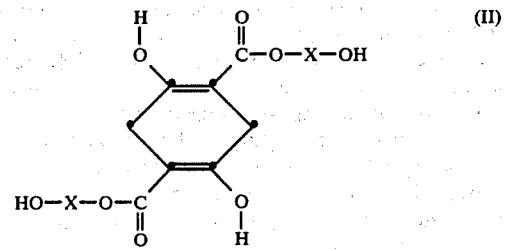

in which X is as defined for formula I, with a maleic acid derivative of the formula III

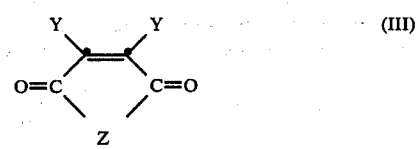

in which Y and Z are as defined for formula I, in a molar ratio of 1:1 to 1:2, preferably under mild conditions, as a melt or in an inert solvent, preferably in a melt, until the product has a relative viscosity of 1.05 to 2.5.

Preferably, the polymers having the structural unit of the formula I are prepared from succinylosuccinic acid derivatives of the formula II, in which X is alkylene having 2 to 10 C atoms. The preferred compound of the formula III is maleic anhydride.

The succinylosuccinic acid derivatives of the formula II and the maleic acid derivatives of the formula III are known. The succinylosuccinic acid derivatives may be prepared, for example, in accordance with the process described in Helvetica Chemica Acta, volume 62, 1979, pages 1682–1687, by trans-esterifying diethyl succinylosuccinate with the Na alcoholate of an alkanediol, or of a cycloaliphatic or cycloaliphatic-aliphatic diol. The said publication for example describes the preparation of the following succinylosuccinic acid derivatives of the formula II: bis-(2-hydroxyethyl) succinylosuccinate, bis-(3-hydroxypropyl) succinylosuccinate, bis-(4-hydroxybutyl) succinylosuccinate, bis-(2,2-dimethyl-3-hydroxypropyl) succinylosuccinate, bis-(6-hydroxyhexyl) succinylosuccinate, bis-(4-hydroxycyclohexyl) succinylosuccinate and bis-[4-(hydroxymethyl)-cyclohexylmethyl] succinylosuccinate.

The alkanediols used to prepare compounds of the formula II can have a linear or branched hydrocarbon radical. Examples of suitable alkanediols are ethylene glycol, 1,2- or 1,3-propylene glycol, 1,3-, 2,3- or 1,4-butanediol, neopentylglycol, 1,6-hexanediol and 1,10-decanediol. Examples of suitable cycloaliphatic diols are 1,4-dihydroxycyclohexane, hydrogenated bisphenol A (2,2-bis-(p-hydroxycyclohexyl)-propane) and hydrogenated bisphenol F (bis-(p-hydroxycyclohexyl)-methane). 1,4-(Dihydroxymethyl)-cyclohexane is an example of a suitable cycloaliphatic-aliphatic diol.

As mentioned at the outset, the linear polymers according to the invention can be converted, by photocuring, into a crosslinked state; the photocuring takes place without elimination of small molecules and accordingly does not entail blistering of the crosslinked polymer.

The polymers according to the invention have a high ultraviolet absorption at wavelengths of λ<300 nm, and can be crosslinked with short-wave ultraviolet light without addition of a photosensitiser. In the longwavelength ultraviolet range, i.e. at wavelengths of λ>300 nm, the polymers according to the invention are stable. Accordingly, photosensitisers are needed to crosslink them in this wavelength range. The polymers according to the invention can also be crosslinked by γ-radiation or by high-velocity electrons.

The polymers according to the invention are useful, for example, for the production of printing plates for the offset printing process, for the preparation of photo-offset lacquers and, in particular, as photoresists for the production of printed circuits by methods known per se. In these, the face of the conductor plate which carries the photosensitive layer is exposed through a negative which shows the conductor pattern and is then developed, the unexposed areas of the layer being dissolved out with developer liquid. The exposure can be effected with sunlight or with light from a carbon arc or a xenon lamp or, preferably, from a mercury high pressure lamp. The base materials can be coated with the photosensitive polymers by conventional techniques, for example by dipping, spraying, whirler coating, cascade coating or curtain coating or by (so-called) roller-coating. The polymers obtained have a fluorescent effect and hence have the advantage that it is not necessary to dye them in order to make them detectable.

The films obtained from the polymers according to the invention by photo-crosslinking are solvent-resistant, and chelate metals, which enables them to be used as an active layer for selective material transport in semipermeable membranes and accordingly as membranes for reverse osmosis. As a result of the chelating capability of the crosslinked polymers, a steady-state surface polarisation can be achieved on the membranes, and this has a particularly advantageous effect in increasing the separating efficiency in reverse osmosis. By subsequently generating the surface polarisation, the latter can be suited to the particular separation problem. The desired polarisation can also be produced direct, during the reverse osmosis, by dissolved metal salts. The polarisation essentially achieves an increase in the retention capacity for metal salts dissolved in the water to be purified.

The films consisting of the crosslinked polymers can be employed as membranes, either direct or reinforced by a porous supporting structure.

Accordingly, the present invention also relates to the use of the photo-crosslinkable polymers according to the invention, having the recurring structural unit of the formula I, as photoresists, or for the preparation of membranes which in particular are useful for reverse osmosis.

EXAMPLES 1-6

Bis-(2-hydroxyethyl) succinylosuccinate ($SBC_2$) or bis-(6-hydroxyhexyl) succinylosuccinate ($SBC_6$) is mixed with maleic anhydride (MA) in the molar ratio shown in Table 1, and the mixture is esterified, and polycondensed, in a conventional manner. The esterification and polycondensation conditions are also shown in Table 1. The yield, and the properties of the polyesters obtained, are shown in Table 1.

The relative viscosity was measured on a solution of 1 g of polyester in 100 ml of a solvent, consisting of equal parts of phenol and o-dichlorobenzene, at 30° C.

TABLE 1

Polyesters obtained from bis-(2-hydroxyethyl) succinylosuccinate ($SBC_2$) or bis-(6-hydroxyhexyl) succinylosuccinate ($SBC_6$) and maleic anhydride (MA)

| Example | $SBC_2$ (g) | MA (g) | Molar ratio | Esterification time/temperature (hours/°C.) | Polycondensation time/temperature (hours/°C.) | Yield (g) | Yield % of theory | Relative viscosity $\eta_{rel}$ | Melting point (°C.) | Glass transition temperature (°C.) |
|---|---|---|---|---|---|---|---|---|---|---|
| 1 | 115.2 | 39.2 | 1:1 | 9/160 | 2/160 | 93 | 63 | 1.09 | 106 | 50 |
| 2 | 8.64 | 4.41 | 1:1.5 | 4/150 | 8.5/150-175 | 6.8 | 62 | 1.07 | 125 | 57 |
| 3 | 8.64 | 5.88 | 1:2 | 4/150 | 4.25/150 | 7.5 | 68 | 1.06 | 92 | 56 |
|   | $SBC_6$ (g) | MA (g) | | | | | | | | |
| 4 | 12.0 | 2.94 | 1:1 | 6/140-180 | 1/140-150 |  |  | 1.14 | 117 | −8 |
| 5 | 8.0 | 2.94 | 1:1.5 | 3.5/150 | 0.5/150 | 8.0 | 83 | 1.18 | 131 | −4 |
| 6 | 8.0 | 3.92 | 1:2 | 4/160 | 0.5/150 | 8.3 | 86 | 1.23 | 1.47 | −6 |
| 7 | 8.0 | 2.94 | 1:1.5 | 2.75/150-160 | 0.75/150 | 7.8 | 81 | 1.19 | 122 | −8 |
| 8 | 80 | 39.2 | 1:2 | 3.5/150 | 0.33/150 | 90 | 94 | 1.20 | 138 | −2 |

EXAMPLES OF APPLICATIONS

EXAMPLE I

A 10% by weight solution in methylene chloride is prepared from the polyester obtained according to Example 1, and is applied to aluminium sheets. The coatings thus obtained are dried in air and are partially masked with aluminium foil. The coatings are then irradiated with unfiltered ultraviolet light (λ>200 nm) for periods varying from 1 to 360 minutes, giving coatings in which the irradiated and non-irradiated areas do not differ in appearance. The coated aluminium sheets are then dipped for 3 minutes in tetrahydrofuran, which dissolves both the unirradiated parts of the coatings, and also those coatings which have been irradiated for periods of up to only 4 minutes.

The coatings irradiated for longer than 4 minutes give uniform, fluorescent films on the metal.

EXAMPLE II

A 25 μm thick film is produced from the polyester prepared according to Example 6, and is irradiated with short-wavelength ultraviolet light (λ>200 nm) from a mercury lamp (type Hanau, TQ 150), from a distance of 30 cm for 4 hours; this results in an acetone-insoluble film. The film is employed as a membrane in a hyperfiltration test. Under a pressure of 100 bar, the water throughput is 0.13 liter/m²d, corresponding to 32.5 liters/m²d for an 0.1 μm thick membrane.

On using an 0.1 N aqueous NaCl solution, under the same experimental conditions, a water throughput of 0.73 liter/m²d is measured, corresponding to 182.5 liters/m²d for an 0.1 μm thick membrane. The salt retention is 97.8%.

What is claimed is:

1. An unsaturated, photo-crosslinkable polymer having a relative viscosity of 1.05 to 2.5, measured on a solution of 1 g of polymer in 100 ml of a solvent, consisting of equal parts of phenol and o-dichlorobenzene, at 30° C., which polymer consists essentially of recurring structural units of the formula I

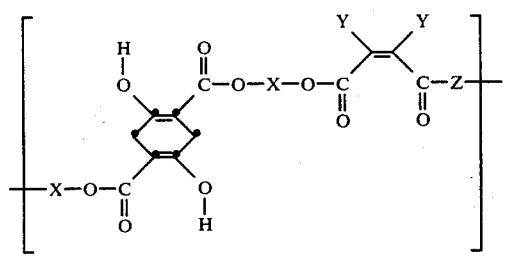

in which X is linear or branched alkylene having 2 to 10 C atoms or a cycloaliphatic or cycloaliphatic-aliphatic radical having up to 15 C atoms, the two Y, independently of one another, are each a hydrogen atom or methyl, and Z is —O—, —NH— or >N—CH₃.

2. A polymer according to claim 1, in which, in the recurring structural unit of the formula I, X is alkylene having 2 to 10 C atoms.

3. A polymer according to claim 1, in which, in the recurring structural unit of the formula I, both Y are a hydrogen atom and Z is an oxygen atom.

4. A polymer according to claim 1, in which, in the recurring structural unit of the formula I, X is alkylene having 2 to 10 C atoms, both Y are a hydrogen atom and Z is an oxygen atom.

5. A process for the preparation of a polymer according to claim 1, which comprises polycondensing a succinylosuccinic acid derivative, containing hydroxyl groups, of the formula II

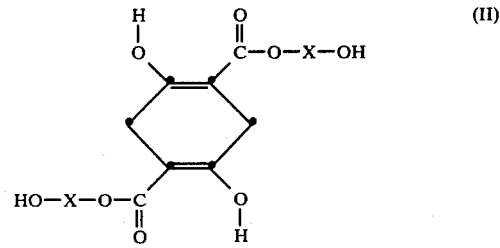

in which X is defined as for formula I, with a maleic acid derivative of the formula III

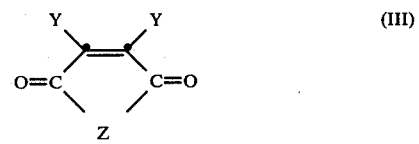

in which Y and Z are as defined for formula I, in a molar ratio of 1:1 to 1:2, as a melt or in an inert solvent, until the product has a relative viscosity of 1.05 to 2.5, measured on a solution of 1 g of polymer in 100 ml of a solvent, consisting of equal parts of phenol and o-dichlorobenzene, at 30° C.

6. A process according to claim 5, wherein a succinylosuccinic acid derivative of the formula II, in which X is alkylene having 2 to 10 C atoms, is used.

7. A process according to claim 5 or 6, in which maleic anhydride is used as the maleic acid derivative of the formula III.

8. A photoresist layer comprising a dry film of the photo-crosslinkable polymer of claim 1.

9. A solvent-resistant membrane for reverse osmosis comprising the photo-crosslinkable polymer of claim 1 subsequent to the crosslinking thereof.

* * * * *